United States Patent
Tokudome et al.

(10) Patent No.: US 9,079,781 B2
(45) Date of Patent: Jul. 14, 2015

(54) THERMOELECTRIC CONVERSION MATERIAL AND THERMOELECTRIC CONVERSION ELEMENT

(75) Inventors: Hiromasa Tokudome, Kanagawa (JP); Naoya Takeuchi, Kanagawa (JP)

(73) Assignee: Toto Ltd., Fukuoka (JP)

( * ) Notice: Subject to any disclaimer, the term of this patent is extended or adjusted under 35 U.S.C. 154(b) by 418 days.

(21) Appl. No.: 13/143,270

(22) PCT Filed: Jan. 6, 2010

(86) PCT No.: PCT/JP2010/050299
§ 371 (c)(1),
(2), (4) Date: Jul. 5, 2011

(87) PCT Pub. No.: WO2010/079841
PCT Pub. Date: Jul. 15, 2010

(65) Prior Publication Data
US 2011/0260120 A1 Oct. 27, 2011

(30) Foreign Application Priority Data

Jan. 6, 2009 (JP) ................. 2009-000778
Jan. 14, 2009 (JP) ................. 2009-005871
Dec. 4, 2009 (JP) ................. 2009-276816

(51) Int. Cl.
*H01L 35/08* (2006.01)
*C01G 9/00* (2006.01)
*H01L 35/22* (2006.01)
*C04B 35/453* (2006.01)

(52) U.S. Cl.
CPC ............. *C01G 9/006* (2013.01); *C04B 35/453* (2013.01); *H01L 35/22* (2013.01); *C01P 2002/50* (2013.01); *C01P 2002/52* (2013.01); *C01P 2004/03* (2013.01); *C01P 2004/04* (2013.01); *C01P 2006/32* (2013.01); *C01P 2006/40* (2013.01); *C01P 2006/80* (2013.01); *C04B 2235/3217* (2013.01); *C04B 2235/3222* (2013.01); *C04B 2235/3224* (2013.01); *C04B 2235/3225* (2013.01); *C04B 2235/3227* (2013.01); *C04B 2235/3229* (2013.01); *C04B 2235/3284* (2013.01); *C04B 2235/443* (2013.01); *C04B 2235/449* (2013.01); *C04B 2235/80* (2013.01); *C04B 2235/9607* (2013.01)

(58) Field of Classification Search
USPC ............ 136/236.1; 252/186.25–33, 500, 518, 252/519.1, 519.5, 521.2
See application file for complete search history.

(56) References Cited

FOREIGN PATENT DOCUMENTS

| | | | |
|---|---|---|---|
| JP | 62-132380 A | | 6/1987 |
| JP | 62-179781 A | | 8/1987 |
| JP | 2001-284661 A | | 10/2001 |
| JP | 2002-033528 A | | 1/2002 |
| JP | 2003-286010 A | | 10/2003 |
| JP | 2006-347861 A | | 12/2006 |
| JP | WO2007/108147 | * | 9/2007 |
| WO | 2007/108147 A1 | | 9/2007 |

OTHER PUBLICATIONS

Tsubota et al., "Transport Properties and Thermoelectric Performance of (Zn1-yMgy)1-xAlxO", Department of Materials Science and Technology, Graduate School of Engineering Science, J. Mater. Chem., 1998, 8(2), 409-412.

Inoue et al., "Thermoelectric Properties of Porous Zinc Oxide Ceramics Doped With Praseodymium", J. Mater Sci (2008) 43:368-377, DOI 10.1007/s10853-006-1314-y, Received: Nov. 9, 2005/Accepted: Nov. 22, 2006/ Published Online: Oct. 17, 2007, Springer + Business Media, LLC 2007.

* cited by examiner

*Primary Examiner* — Monique Peets
(74) *Attorney, Agent, or Firm* — Carrier Blackman & Associates, P.C.; Joseph P. Carrier; Fulchand P. Shende

(57) ABSTRACT

Disclosed is a thermoelectric conversion material that exhibits a high thermoelectric conversion properties. The thermoelectric conversion material comprises zinc oxide and is represented by formula (I):

$$Zn_{(1-x-y)}Al_xY_yO \qquad (I)$$

wherein Zn represents zinc; Al represents aluminum; Y represents yttrium; and x>0, y>0, and x+y<0.1, and has a structure in which at least a part of aluminum and yttrium are present in crystal lattices of and/or interstitial site of crystal lattices of zinc oxide.

9 Claims, 6 Drawing Sheets

THERMOELECTRIC CONVERSION MATERIAL AND THERMOELECTRIC CONVERSION ELEMENT

BACKGROUND OF THE INVENTION

1. Field of Invention

The present invention relates to a metal oxide-based thermoelectric conversion material for use in thermoelectric conversion elements.

2. Background Art

In recent years, thermoelectric conversion elements using metal oxides have been proposed as a technique that solves problems of high-temperature durability and toxicity involved in conventional metal compound-based thermoelectric conversion elements, and studies on the thermoelectric conversion elements using metal oxides have made rapid progress. In general, properties of thermoelectric conversion elements are expressed by a few characteristic factors using a Seebeck coefficient $\alpha$ ($\mu V \cdot K^{-1}$) that is a thermoelectromotive force per unit temperature difference, an electroconductivity $\sigma$ ($S \cdot cm^{-1}$), and a coefficient of thermal conductivity $\kappa$ ($W \cdot m^{-1} \cdot K^{-1}$). One of the factors is a thermoelectric power factor represented by $\alpha^2 \sigma$. Further, a figure-of-merit obtained by dividing a thermoelectric power factor by a coefficient of thermal conductivity, i.e., Z ($=\alpha^2 \sigma/\kappa$), and a dimensionless figure-of-merit ZT obtained by multiplying a figure-of-merit Z by an absolute temperature T are used as performance measures. In general, the larger these values, the better the thermoelectric properties.

The thermoelectric conversion element is generally prepared by combining two types of metals or semiconductors. A combination of a p-type semiconductor in which carriers are holes with an n-type semiconductor in which electrons are carriers is required in order to generate electric power with high efficiency. In existing oxide semiconductors, a high ZT of about 0.7 ($NaCO_2O_4$ polycrystal) comparable to that of metal compounds is reported in the p-type. On the other hand, in the n-type, the ZT is up to about 0.3 and is an obstacle to the popularization of thermoelectric conversion devices using metal oxides. At the present time, a demand for the breakthrough of thermoelectric properties of n-type oxide semiconductors has become more and more very strong.

Aluminum (Al) doped zinc oxide (Al—ZnO) is known as an n-type oxide semiconductor that exhibits a high level of thermoelectric properties (PTL 1). In Al—ZnO, however, a very high coefficient of thermal conductivity due to a high debye temperature and a high acoustic phonon speed is a factor that inhibits a further improvement in ZT. In order to lower the coefficient of thermal conductivity of Al—ZnO-based materials, studies have hitherto been made, for example, on formation of solid-solution of Mg or Ni co-doped with Al in ZnO (NPL 1). Further, there is a report about a system that is based on Al—ZnO and is co-doped with La (PTL 2) and a system that is based on Al—ZnO and is co-doped with Ce (PTL 3). In these prior art techniques, the particle diameter of zinc oxide is preferably not more than 200 nm (for example, paragraphs 0006 and 0013 of PTL 2).

ZnO sintered compacts doped with yttrium (Y) have also been studied (PTL 4). Likewise, zinc oxide sintered compacts doped with praseodymium (Pr) have also been studied (NPL 2).

CITATION LIST

Patent Literature

[PTL 1] JP S62(1987)-132380A
[PTL 2] JP 2001-284661A
[PTL 3] JP 2006-347861A
[PTL 4] JP S62(1987)-179781A

Non Patent Literature

[NPL 1] J. Mater. Chem., 1998, 8(2), 409-412
[NPL 2] J. Mater. Sci., (2008) 43:368-377

SUMMARY OF THE INVENTION

Technical Problems

However, despite the conventional proposals, there is still a demand for n-type oxide semiconductors (n-type thermoelectric conversion materials) having satisfactory thermoelectric properties. An object of the present invention is to provide an n-type oxide semiconductor (an n-type thermoelectric conversion material) that exhibits higher thermoelectric conversion properties than conventional n-type oxide semiconductors composed mainly of zinc oxide.

Solution to Problems

The present inventors have now found that a zinc oxide sintered compact comprising zinc oxide as a main component and yttrium (Y) and aluminum (Al) is an excellent thermoelectric conversion material that, despite a lower coefficient of thermal conductivity than that of Al—ZnO, has very high electroconductivity and Seebeck coefficient and, at the same time, has high thermoelectric properties.

The present inventors have further found a production process that, regarding a thermoelectric conversion material obtained by doping zinc oxide with aluminum (Al) and further doping Al—ZnO with a rare earth metal selected from the group consisting of La, Ce, Pr, Nd, Pm, Sm, Eu, Gd, Tb, Dy, Ho, and Y, can produce a material having better properties.

The present invention has been made based on such findings.

According to one aspect of the present invention, there is provided a thermoelectric conversion material which is represented by compositional formula (I):

$$Zn_{(1-x-y)}Al_xY_yO \qquad (I)$$

wherein Zn represents zinc; Al represents aluminum; Y represents yttrium; and $x>0$, $y>0$, and $x+y<0.1$, and which has a structure in which at least a part of aluminum and yttrium are present in crystal lattices of and/or interstitial site of crystal lattices of zinc oxide.

According to another aspect of the present invention, there is provided a process for producing a thermoelectric conversion material, the process comprising the steps of: mixing a zinc oxide (ZnO) powder, a rare earth element powder, and an aluminum oxide ($Al_2O_3$) powder together by milling; molding; and sintering the molded product at a predetermined temperature, wherein the rare earth element is selected from the group consisting of yttrium (Y) and rare earth elements having a larger ion radius than yttrium: lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho), and the zinc oxide powder having a primary particle diameter of not less than 0.5 μm and not more than 5 μm is used.

According to still another aspect of the present invention, there is provided another process for producing a thermoelectric conversion material, the process comprising the steps of: providing an aqueous solution comprising a zinc ion, a rare earth element ion, and an aluminum ion; producing an oxide precursor from the aqueous solution; and firing the precursor to obtain an oxide, wherein the rare earth element is selected from the group consisting of yttrium (Y) and rare earth elements having a larger ion radius than yttrium: lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho).

Effects of the Invention

The thermoelectric conversion material according to the present invention exhibits high electroconductivity and Seebeck coefficient and has a low coefficient of thermal conductivity and thus can develop high thermoelectric conversion properties. Accordingly, the application of the material to highly efficient thermoelectric conversion elements can be realized.

DESCRIPTION OF EMBODIMENTS

Thermoelectric Conversion Material

Figure 1:
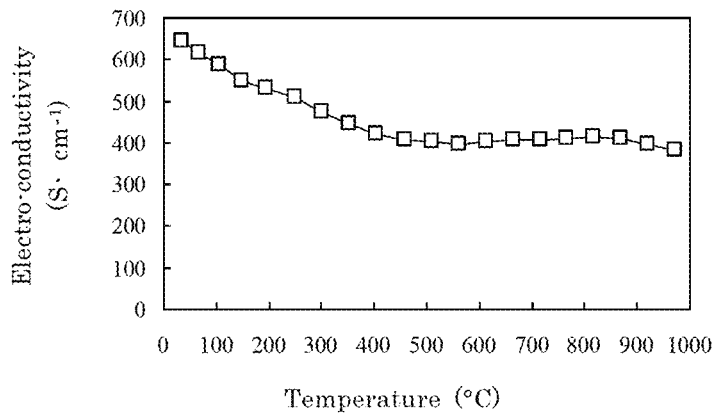
FIG. 1 is a graph showing the dependence of the electroconductivity of a thermoelectric conversion material according to the present invention upon temperature.

The thermoelectric conversion material according to the present invention is composed mainly of zinc oxide which is represented by formula (I): $Zn_{(1-x-y)}Al_xY_yO$, and which has a structure with at least a part of aluminum and yttrium being present in crystal lattices of and/or interstitial site of crystal lattices of zinc oxide.

Here, Zn represents zinc; Al represents aluminum; and Y represents yttrium.

The content of Al in terms of moles based on the total moles of Zn, Al, and Y, that is, x in formula (I), is more than 0, the content of Y in terms of moles based on the total moles of Zn, Al, and Y, that is, y in formula (I), is more than 0, and the content of Al and Y in terms of moles based on the total moles of Zn, Al, and Y, that is, x+y in formula (I), is less than 0.10.

The thermoelectric conversion material according to the present invention has high electroconductivity and Seebeck coefficient and a low coefficient of thermal conductivity and thus can be a thermoelectric conversion material having a high level of thermoelectric properties that is a high-performance n-type oxide semiconductor.

The reason why the thermoelectric conversion material according to the present invention has a high level of thermoelectric properties has not been elucidated yet but is expected as follows. However, it should be noted that the following theory is an expectation and the present invention is not limited by this theory.

In the thermoelectric conversion material according to the present invention, zinc oxide doped with aluminum (Al) has been further doped with yttrium (Y). Aluminum may be present in any crystal site, for example, within crystal lattices of, interstitial site of crystal lattices of, or in grain boundaries of zinc oxide. It is considered that aluminum is doped into zinc sites of zinc oxide in substitutional solid solution to produce free electrons that serve as carriers responsible for high electronic conduction that provides high electroconductivity. Further, yttrium may be present in any crystal site, for example, within crystal lattices of zinc oxide, interstitial site of crystal lattices of zinc oxide, or in grain boundaries of zinc oxide. Since, however, yttrium has a larger ion radius than zinc, it is considered that yttrium is less likely to be doped into zinc sites of zinc oxide in substitutional solid solution and, consequently, a large amount of yttrium ions are present at interstitial sites of crystal lattices where an increase in resistance caused by scattering of carriers and barrier layer formation is less likely to occur. That is, it is considered that, in the thermoelectric conversion material according to the present invention, doping of aluminum into zinc oxide can allow carriers having a capability of developing high electroconductivity to be produced and, further, the doped yttrium functions as a reaction center that does not scatter carriers produced by doping of aluminum into zinc oxide but scatters only phonons, whereby high thermoelectric properties can be developed.

The reason why doping of yttrium into zinc oxide can allow a higher level of thermoelectric properties than that in conventional doping of other rare earth metals such as La (lanthanum) or Ce (cerium) to be obtained has not been elucidated yet but is expected as follows. However, it should be noted that the following theory is an expectation and the present invention is not limited by this theory. When a presumption of trivalent and 6 coordination is made on the rare earth metal, the ion radius is about 74.5 to 104.5 pm. The ion radius referred to herein is that reported by Shannon (R. D. Shanon, Acta. Crystallography A, vol. 32, p. 751, 1976). When the ion radius of the rare earth metal to be doped is close to the ion radius of $Zn^{2+}$ (60 pm for 4 coordination and 75 pm for 6 coordination), substitutional solid solution in crystal lattices of zinc oxide is likely to occur and there is a possibility that carriers produced by Al doping are scattered in the rare earth metal, whereby the electroconductivity is lowered. On the other hand, when the ion radius of the rare earth metal to be doped is excessively large, the dissolution of the rare earth metal as a solid solution or a interstitial solid solution becomes difficult and, consequently, the rare earth metal is likely to be segregated in grain boundaries. When carriers are passed through grain boundaries, the segregated rare earth metal possibly functions as a high-resistivity barrier layer and, here again, there is a possibility that the electroconductivity is lowered. That is, preferably, the rare earth metal to be further doped into aluminum-doped zinc oxide has an ion radius that is moderately larger than that of zinc and is small enough to be dissolved as a interstitial solid solution. It is considered that, when yttrium having an ion radius of 90 pm is used, a large amount of yttrium ion is present in sites within crystals where an increase in electric resistance attributable to scattering of carriers or barrier layer formation does not occur, whereby a thermoelectric conversion material having higher thermoelectric properties which functions as an n-type oxide semiconductor can be realized.

In a preferred embodiment of the present invention, the content of Al and Y in terms of moles based on the total moles of Zn, Al, and Y, that is, x+y in formula (I), is not more than 0.07, more preferably not more than 0.06. In a preferred embodiment of the present invention, the content of Y in terms of moles based on the total moles of Zn, Al, and Y, that is, y in formula (I), is smaller than a value obtained by adding 0.01 to the content of Al in terms of moles based on the total moles of Zn, Al, and Y, that is, x in formula (I). More preferably, the content of Y in terms of moles based on the total moles of Zn, Al, and Y, that is, y in formula (I), is not more than the content of Al in terms of moles based on the total moles of Zn, Al, and Y, that is, x in formula (I).

When the content of Y in terms of moles based on the total moles of Zn, Al, and Y is excessively small, a function as a phonon scattering center is substantially deteriorated and, consequently, there is a possibility that the level of an improvement in thermoelectric properties is lowered. On the other hand, when the content of Y in terms of moles is excessively large, a part of the rare earth metal oxide remains unreacted and, consequently, there is a possibility, for example, that the electroconductivity is lowered. In a preferred embodiment of the present invention, when the content of Y in terms of moles based on the total moles of Zn, Al, and Y, that is, y in formula (I), is not less than 0.001 and not more than 0.03, very high electroconductivity and high thermoelectric properties can be obtained. When the content of Al in terms of moles based on the total moles of Zn, Al, and Y is excessively small, the number of electrons which are carriers is so small that the level of an improvement in thermoelectric properties is possibly lowered. On the other hand, when the content of Al in terms of moles is excessively large, a large amount of a spinel phase having low electroconductivity (such as $ZnAl_2O_4$) is produced and is segregated in grain boundaries of zinc oxide particles and, consequently, there is a possibility, for example, that the electroconductivity is lowered. In a preferred embodiment of the present invention, when the content of Al in terms of moles based on the total moles of Zn, Al, and Y, that is, x in formula (I), is not less than 0.001 and not more than 0.05, very high electroconductivity and high thermoelectric properties can be obtained.

Process for Producing Thermoelectric Conversion Material

The thermoelectric conversion material according to the present invention may take any form of thin films, thick films, and bulk molded products according to a module form.

The thin film may be prepared, for example, by a physical film formation method (for example, sputtering, molecular beam epitaxy, or vacuum deposition), chemical vapor deposition (CVD), or chemical film formation (for example, wet-type film formation such as spin coating, dip coating, or bar coating).

The thick film may be prepared, for example, by sheet forming, screen printing, aerosol deposition, or doctor blading.

The shape of the bulk molded product is most preferably required of the modularization of the thermoelectric conversion material. A conventional ceramic molding process can be utilized for the preparation of the bulk molded product. For example, the bulk molded product may be prepared using a commercially available oxide powder as the starting material. In a preferred embodiment of the present invention, the bulk molded product is prepared by mixing a zinc oxide (ZnO) powder, a yttrium oxide ($Y_2O_3$) powder, and an aluminum oxide ($Al_2O_3$) powder together by dry or wet milling, molding the mixture, and sintering the molded product at a predetermined temperature (this method will be hereinafter sometimes referred to as "solid phase method"). Alternatively, the bulk molded product may also be prepared by firing the powder at or above a predetermined temperature to satisfactorily dissolve the rare earth metal and aluminum as a solid solution in zinc oxide, then molding the solid solution, and sintering the molded product.

A known or general method for obtaining a metal oxide may also be used that comprises dissolving nitrate, hydroxide, chloride or the like of zinc, yttrium, and aluminum in water, producing an oxide precursor from an aqueous solution comprising zinc, yttrium, and aluminum ions, firing the precursor to produce an oxide, and firing and processing the oxide (this method will be hereinafter sometimes referred to as "wet-type reaction method"). Methods for obtaining the oxide precursor include, for example, coprecipitation method, homogeneous precipitation method, citric acid method, and complex polymerization method. It is considered that the thermoelectric conversion material obtained by the method has a structure comprising aluminum and yttrium present in crystal lattices of zinc oxide or interstitial site of crystal lattices of zinc oxide and thus can realize a higher level of thermoelectric properties. Further, it is considered that fine particles having a composition of $ZnAl_2O_4$ are produced within primary particles of ZnO, the fine particles having a composition different from ZnO do not inhibit the migration of electrons (that is, the realization of high conductivity) while the fine particles scatter phonons to lower the coefficient of thermal conductivity (see the results of a transmission electron microscope-energy dispersion X-ray spectroscopic elementary analysis (TEM-EDS) in working examples which will be described later), whereby good thermoelectric properties can be obtained.

Both dry molding and wet molding methods are suitable as the molding method. Dry molding methods include, for example, uniaxial press molding, hot pressing, and hot forging. Wet molding methods include, for example, injection molding, cast molding, extrusion, pressure molding, and centrifugal molding. Cold isostatic pressing (CIP) may be carried out to improve the packing density of the molded product produced by the molding method.

In the present invention, the firing temperature at which the sintered compact of zinc oxide is produced may be such that ZnO is sintered and, further, a dopant is dissolved as a solid solution in ZnO crystal lattices. The firing temperature is preferably 1000 to 1500° C. In order to improve the sinterability, for example, spark plasma sintering (SPS) may be utilized. Further, firing may be carried out in an inert gas such as nitrogen to improve the electroconductivity of the thermoelectric conversion material according to the present invention. This method can be expected to contribute to a significant improvement in electroconductivity due to an increase in oxygen defects.

The thermoelectric conversion properties of the thermoelectric conversion material in the present invention can be measured with a thermoelectric property measuring device (for example, "RZ2001i," manufactured by OZAWA SCIENCE CO., LTD). The electroconductivity (σ) and the Seebeck coefficient (α) can be measured under such conditions that, in each temperature range (for example, 0 to 1000° C.), a temperature difference is provided between both ends of a sample, whereby a thermoelectric power factor ($α^2σ$) can be determined.

Further, the coefficient of thermal conductivity κ can be determined by a laser flash thermal property measuring device (for example, "LFA-502," manufactured by Kyoto Electronics Manufacturing Co., Ltd.). When laser beams having an even energy density are applied in a pulse form to a surface of a measuring sample to evenly heat the measuring sample, the coefficient of thermal diffusivity can be determined by detecting a time, which is required for the diffusion of the heat into the backside of the sample, and a temperature change, and the coefficient of thermal conductivity can be determined from these data and sample density. The above measurements can allow ZT ($=α^2σ/κ$) to be determined from the electroconductivity, the Seebeck coefficient, and the coefficient of thermal conductivity in various temperature ranges.

The electroconductivity at room temperature can be determined with an electroconductivity measuring device (for example, "Loresta GP," manufactured by Mitsubishi Chemical Corporation).

Further, in another embodiment of the present invention, in the "solid phase method," a zinc oxide powder having a primary particle diameter of not less than 0.5 μm and not more than 5 μm is used. When particles having the particle diameter are used, thermoelectric conversion materials having higher electroconductivity and higher thermoelectric properties can be obtained. Further, also in the yttrium oxide powder and the aluminum oxide powder, the use of particles having a primary particle diameter of not more than 100 nm is preferred. According to this embodiment, thermoelectric conversion materials having higher electroconductivity and higher thermoelectric properties can be obtained. It is considered that the thermoelectric conversion material obtained by this method has a structure comprising aluminum and yttrium present in crystal lattices of zinc oxide or interstitial site of crystal lattices of zinc oxide and thus can realize higher thermoelectric properties. Further, it is considered that fine particles having a composition of $YAlO_3$ are produced within primary particles of ZnO, the fine particles having a composition different from ZnO do not inhibit the migration of electrons (that is, the realization of high conductivity) while the fine particles scatter phonons to lower the coefficient of thermal conductivity (see the results of a transmission electron microscope-energy dispersion X-ray spectroscopic elementary analysis (TEM-EDS) in working examples which will be described later), whereby good thermoelectric properties can be obtained.

In another embodiment of the present invention, in the "solid phase method," the use of a zinc oxide powder having a primary particle diameter of not less than 0.5 μm and not more than 5 μm is also preferred in the production of a thermoelectric conversion material comprising aluminum-doped zinc oxide that has been doped with a rare earth element that has a larger ion radius than yttrium and is selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho). That is, according to another aspect of the present invention, there is provided a process for producing a thermoelectric conversion material, the process comprising at least the steps of: mixing a zinc oxide (ZnO) powder, a rare earth element oxide powder, and an aluminum oxide ($Al_2O_3$) powder together by milling; molding the mixture; and sintering the molded product at a predetermined temperature, the rare earth element being selected from the group consisting of rare earth elements having a larger ion radius than yttrium: lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho), the zinc oxide powder having a primary particle diameter of not less than 0.5 μm and not more than 5 μm. The compositional formula of the thermoelectric conversion material produced by the process and comprising aluminum-doped zinc oxide that has been doped with the rare earth element (excluding those having a smaller ion radius than yttrium) is preferably as follows.

$$Zn_{(1-x-y)}Al_xM_yO$$

wherein Zn represents zinc; Al represents aluminum; M represents a rare earth element (excluding those having a smaller ion radius than yttrium); and x>0, y>0, and x+y<0.1. According to this process, thermoelectric conversion materials having higher electroconductivity and thermoelectric properties can be obtained. Also in this aspect, preferably, the rare earth element oxide powder and the aluminum oxide powder as well have a primary particle diameter of not more than 100 nm. According to this constitution, thermoelectric conversion materials having higher electroconductivity and higher thermoelectric properties can be obtained.

Further, in still another embodiment of the present invention, the "wet-type reaction method" is also preferred in the production of a thermoelectric conversion material comprising aluminum-doped zinc oxide that has been doped with a rare earth element that has a larger ion radius than yttrium and is selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho). Thus, according to still another aspect of the present invention, there is provided a process for producing a thermoelectric conversion material, the process comprising at least the steps of: providing an aqueous solution comprising a zinc ion, a rare earth element ion, an aluminum ion; producing an oxide precursor from the aqueous solution; and firing the precursor to obtain an oxide, the rare earth element being selected from the group consisting of yttrium (Y) and rare earth elements having a larger ion radius than yttrium: lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho). According to a preferred embodiment of the present invention, there is provide a method in which the oxide is represented by the following compositional formula:

$$Zn_{(1-x-y)}Al_xM_yO$$

wherein Zn represents zinc; Al represents aluminum; M represents a rare earth element (excluding those having a smaller ion radius than yttrium); and x>0, y>0, and x+y<0.1. According to this process, thermoelectric conversion materials having higher electroconductivity and thermoelectric properties can be obtained. It is considered that the thermoelectric conversion material obtained by this process has a structure comprising aluminum and the rare earth element present within particles of zinc oxide, that is, present in crystal lattices or interstitial site of crystal lattices of zinc oxide and, thus, higher thermoelectric properties can be realized.

EXAMPLES

The present invention is further illustrated by the following Examples that are not intended as a limitation of the invention.

Sample 11

Preparation of Sintered Compact of Zinc Oxide Comprising Rare Earth Metal and Aluminum Using Coprecipitation Method as Wet-type Reaction Method Zinc acetate (0.098 mol; manufactured by Wako Pure Chemical Industries, Ltd.) and 0.001 mol of yttrium nitrate n hydrate containing yttrium as a rare earth element that serves as a dopant (manufactured by Wako Pure Chemical Industries, Ltd.) are dissolved in 1000 ml of distilled water, and the solution was stirred at room temperature for about one hr. A 0.1 M aqueous sodium hydroxide solution (1000 ml) was added dropwise at room temperature for one hr to the aqueous metal salt solution thus prepared while stirring the solution, and the mixture was then stirred for about 20 hr. Further, a solution of 0.001 mol of aluminum lactate (manufactured by Wako Pure Chemical Industries, Ltd.) dissolved in 10 ml of distilled water was added dropwise to the resultant suspension for 10 min while stirring the suspension, and the mixture was stirred for about 20 hr. After the completion of the stirring, the stirred mixture was centrifuged to collect while gel. Washing treatment with distilled water and centrifugation were repeated until pH of the supernatant became about 7, thereby obtaining white gel. The white gel thus obtained was filtered by suction filtration, was washed with 100 ml of ethanol, and was then dried at 60° C. for 2 hr to obtain a white thin sheet-like material.

The thin sheet-like material was fired at 500° C. for one hr, and a white powder was collected. The white powder was pressed by a monoaxial press molding machine and was further treated by cold isostatic pressing (CIP) to prepare disk-shaped pellets having a diameter of about 25 mm and a thickness of about 7 mm.

Sample 11 was prepared by firing the disk-shaped pellets in the air at 1400° C. for 10 hr to sinter the disk-shaped pellets. A quantitative analysis was carried out by an inductive coupling plasma mass analyzer (ICP-MS) to analyze the composition of the sintered compact. As a result, it was found that the composition of sample 11 was $Zn_{0.977}Y_{0.014}Al_{0.009}O$.

Samples 12 to 16

Preparation of Sintered Compact of Zinc Oxide Comprising Rare Earth Metal and Aluminum Using Citric Acid Method as Wet-type Reaction Method Zinc nitrate hexahydrate (manufactured by Wako Pure Chemical Industries, Ltd.), aluminum nitrate nonahydrate (manufactured by Wako Pure Chemical Industries, Ltd.), and a rare earth metal nitrate (all of yttrium nitrate, cerium nitrate, and lanthanum nitrate being manufactured by Wako Pure Chemical Industries, Ltd.) were weighed at a predetermined molar ratio specified in Table 1. They, together with 0.25 mol of citric acid (manufactured by Wako Pure Chemical Industries, Ltd.), were placed in a 500-ml beaker and were dissolved in 250 ml of distilled water, and the solution was stirred for about 2 hr. Further, water was evaporated while stirring the solution at 120° C. The residue was heated with a mantle heater to 450° C. to thermally decompose organic matter such as citric acid and nitric acid to obtain a black to gray zinc oxide precursor. Thereafter, the zinc oxide precursor was calcined at 500° C. for one hr and further at 800° C. for 4 hr to obtain a zinc oxide powder doped with various metal ions. In the preparation of samples 13 and 14, the amount of citric acid was 0.75 mol. The powder thus obtained was pressed by a monoaxial press molding machine and further treated by cold isostatic pressing (CIP) to prepare disk-shaped pellets having a diameter of about 25 mm and a thickness of about 7 mm. The disk-shaped pellets were fired in the air at 1400° C. for about 10 hr to sinter the pellets and thus to prepare samples 12 to 16.

Samples 21 to 73

Preparation of Sintered Compact of Zinc Oxide Comprising Rare Earth Metal and Aluminum by Dry Mixing Method A zinc oxide powder (manufactured by Kojundo Chemical Laboratory Co., Ltd., particle diameter about 1 µm), an aluminum oxide powder (γ-$Al_2O_3$, manufactured by Kojundo Chemical Laboratory Co., Ltd., particle diameter about 2 to 3 µm), and rare earth oxide powders ($Y_2O_3$, $Eu_2O_3$, $Gd_2O_3$, $Dy_2O_3$, $Er_2O_3$, $Tm_2O_3$, $Yb_2O_3$, $CeO_2$, $Sc_2O_3$, and $Ho_2O_3$: all of the products being manufactured by The Shin-Etsu Chemical Co., Ltd., $La_2O_3$: manufactured by Daiichi Kigenso Kagaku Kogyo Co.) were provided. These starting materials were weighed at a predetermined molar ratio specified in Table 1 and were introduced into a polyethylene bottle. Iron balls covered with nylon were added, followed by dry ball milling for 15 hr. The powder was separated by a metal mesh, was pressed by a monoaxial press molding machine, and was further treated by cold isostatic pressing (CIP) to prepare disk-shaped pellets having a diameter of about 25 mm and a thickness of about 7 mm. The disk-shaped pellets were fired in the air at 1400° C. for about 10 hr to sinter the pellets. Thus, samples 21 to 73 were prepared. In the preparation of samples 21 to 26, 28, 38, and 39, an aluminum oxide powder having a small particle diameter (γ-$Al_2O_3$, manufactured by TAIMEI CHEMICALS CO., LTD., primary particle diameter 7 nm) was used. In the preparation of samples 71 to 73, a zinc oxide powder having a small particle diameter (HakusuiTech Co., Ltd., particle diameter about 200 nm) was used.

For $Y_2O_3$ (part number: BB), manufactured by Kojundo Chemical Laboratory Co., Ltd., among the rare earth oxide powders used as the starting materials, the particle diameter was observed under SEM and was found to be 20 to 30 nm. For γ-$Al_2O_3$ (part number: TM-300) manufactured by TAIMEI CHEMICALS CO., LTD., the particle diameter was observed under SEM and was found to be not more than 100 nm.

Evaluation 1: X-Ray Diffractometric Analysis

An X-ray diffractometric analysis was carried out for the samples thus obtained. As a result, the samples belonged substantially to a single phase of wurtzite zinc oxide.

Evaluation 2: Measurement of Electroconductivity at Room Temperature of Sintered Compact of Zinc Oxide Comprising Rare Earth Metal and Aluminum The sintered compacts of zinc oxide thus obtained were taken off in a size of 5 mm×5 mm×15 mm with a diamond cutter, and the whole surface was polished with a sand paper to prepare measurement samples.

For samples taken off in a square column having a size of about 5 mm×about 5 mm×about 15 mm, the electroconductivity at room temperature was measured by a four probe method with a resistivity meter (Loresta GP, manufactured by Mitsubishi Chemical Corporation). For each sample, the composition ratio and the electroconductivity at room temperature (20° C.) are shown in Table 1.

Evaluation 3: Measurement of Thermoelectric Properties of Sintered Compact of Zinc Oxide Comprising Rare Earth Metal and Aluminum The sintered compacts of zinc oxide thus obtained were taken off into a square column having a size of about 5 mm×about 5 mm×about 15 mm to prepare measurement samples. The electroconductivity ($\sigma$) and the Seebeck coefficient ($\alpha$) were measured with a thermoelectric property measuring device (for example, "RZ2001i," manufactured by OZAWA SCIENCE CO., LTD.) under such conditions that, in each temperature range (for example, 0 to 1000° C.), a temperature difference was provided between both ends of a sample. Further, for measurement samples obtained by taking off the sintered compacts of zinc oxide into a sheet having a size of 5 mm×5 mm×1 mm in thickness, the coefficient of thermal conductivity ($\kappa$) was measured in a temperature range from room temperature to 1000° C. with a laser flash thermal property measuring device (for example, "LFA-502," manufactured by Kyoto Electronics Manufacturing Co., Ltd.).

Further, the output factor ($=\alpha^2\sigma$) and dimensionless performance index ZT($=\alpha^2\sigma/\kappa$) at 972° C. were calculated using the measurement results of electroconductivity, Seebeck coefficient, and coefficient of thermal conductivity.

The electroconductivity, Seebeck coefficient, coefficient of thermal conductivity, and output factor and dimensionless performance index at 972° C. for each sample are shown in Table 1.

Figure 2:
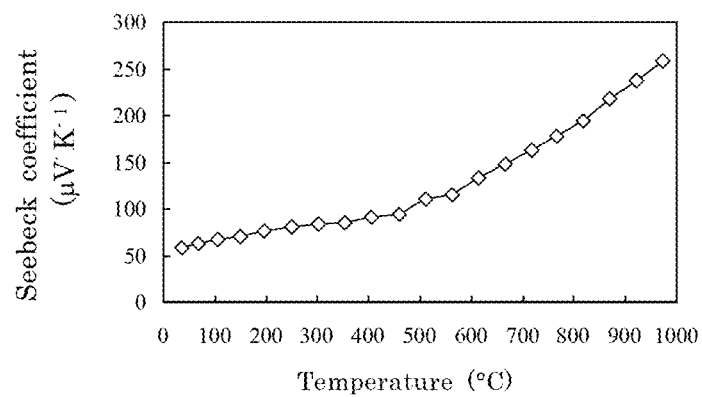
FIG. 2 is a graph showing the dependence of the Seebeck coefficient of a thermoelectric conversion material according to the present invention upon temperature.
Figure 3:
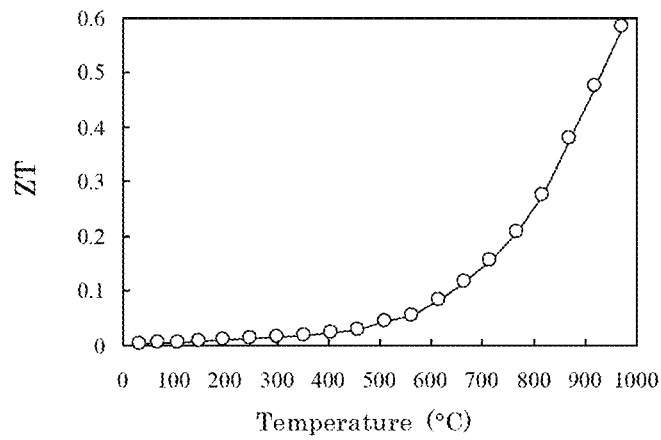
FIG. 3 is a graph showing the dependence of a dimensionless figure-of-merit ZT of a thermoelectric conversion material according to the present invention upon temperature.
Figure 4:
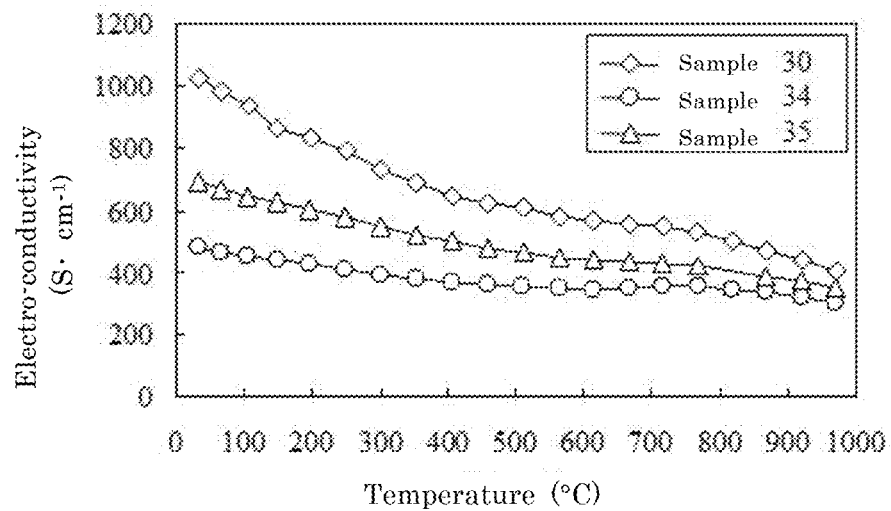
FIG. 4 is a graph showing the dependence of the electroconductivity of a thermoelectric conversion material according to the present invention upon temperature.
Figure 5:
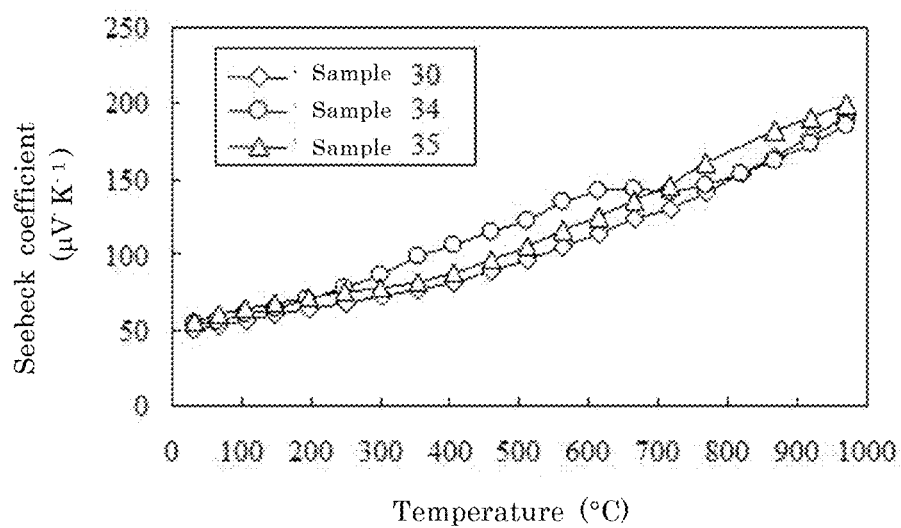
FIG. 5 is a graph showing the dependence of the Seebeck coefficient of a thermoelectric conversion material according to the present invention upon temperature.
Figure 6:
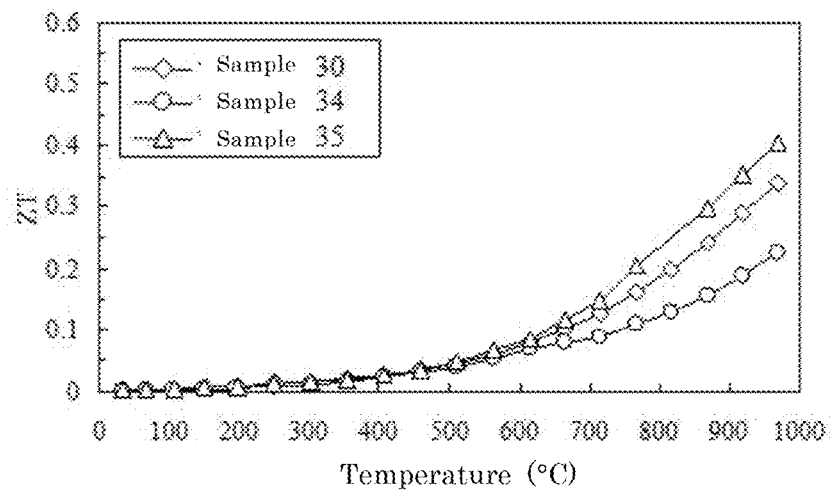
FIG. 6 is a graph showing the dependence of a dimensionless figure-of-merit ZT of a thermoelectric conversion material according to the present invention upon temperature.

FIG. 1 is a graph showing electroconductivity at each temperature for sample 11, FIG. 2 is a graph showing Seebeck coefficient at each temperature for sample 11, and FIG. 3 is a graph showing a relationship between the dimensionless performance index ZT and the temperature for sample 11. FIG. 4 is a graph showing electroconductivity at each temperature for samples 30, 34, and 35, FIG. 5 is a graph showing Seebeck coefficient at each temperature for these samples, and FIG. 6 is a graph showing a relationship between the dimensionless performance index ZT and the temperature for these samples.

As shown in FIG. 1, for sample 11, the electroconductivity slightly lowers with an increase in temperature, demonstrating that sample 11 has metallic electronic conduction. This fact shows that Al as a dopant is dissolved as a solid solution in crystals of zinc oxide. Further, sample 11 exhibited a high electroconductivity of not less than 380 S·cm$^{-1}$ in a temperature range of room temperature to 1000° C. Further, as shown in FIG. 2, the Seebeck coefficient was negative, indicating that the sintered compact of zinc oxide of sample 11 was an n-type material. The absolute value of Seebeck coefficient was high and not less than 200 µV·K$^{-1}$ in a temperature range of 800 to 1000° C. Further, ZT at 972° C. was 0.58, that is, has high thermoelectric properties.

As shown in FIG. 4, also for these samples, the electroconductivity is likely to slightly decrease with an increase in temperature, indicating that these samples exhibit metallic electronic conduction. This fact indicates that Al as a dopant is dissolved as a solid solution in crystals of zinc oxide. Further, these samples exhibited a high electroconductivity of not less than 300 S·cm$^{-1}$ in a temperature range of room temperature to 1000° C. The Seebeck coefficient was negative, indicating that the sintered compacts of zinc oxide of samples 4, 7, and 8 were an n-type material. Further, as shown in FIG. 5, the absolute value of Seebeck coefficient was high and not less than 150 µV·K$^{-1}$ in a temperature range of 800 to 1000° C. Further, ZT values of samples 4, 7, and 8 at 972° C. were 0.34, 0.23, and 0.41, respectively, that is, had high thermoelectric properties.

Figure 7:
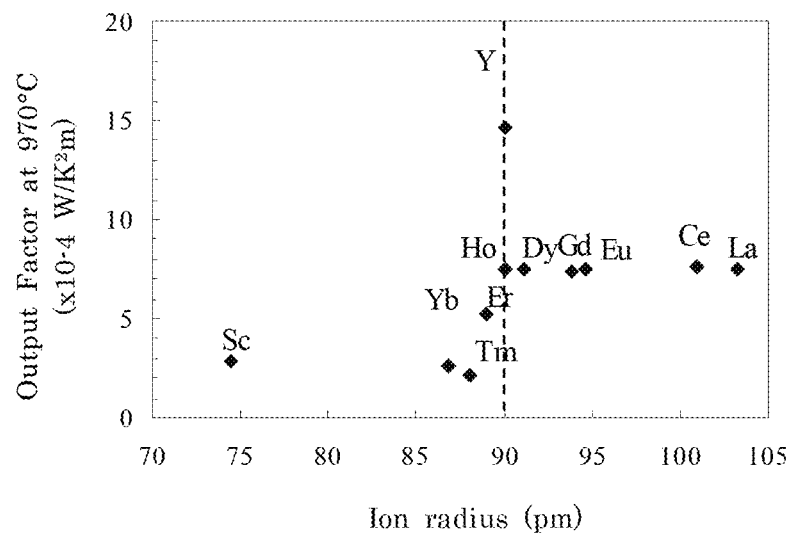
FIG. 7 is a graph showing an power factor plotted against an ion radius of a rare earth metal ion for doping into a zinc oxide sintered compact.

FIG. 7 is a graph showing output factor $\alpha^2\sigma_{972}$ at 972° C. plotted against the ion radius of each rare earth metal in samples having compositions of $Zn_{0.96}M_{0.01}Al_{0.03}O$ wherein M represents Sc, Yb, Tm, Er, Y, Ho, Dy, Gd, Eu, Ce, and La. As is apparent from the graph, it was found that specifically high thermoelectric properties were provided when yttrium ions ($Y^{3+}$) were doped.

Evaluation 4: Transmission Electron Microscope-Energy Dispersion X-Ray Spectroscopic Elementary Analysis (TEM-EDS)

Figure 8:
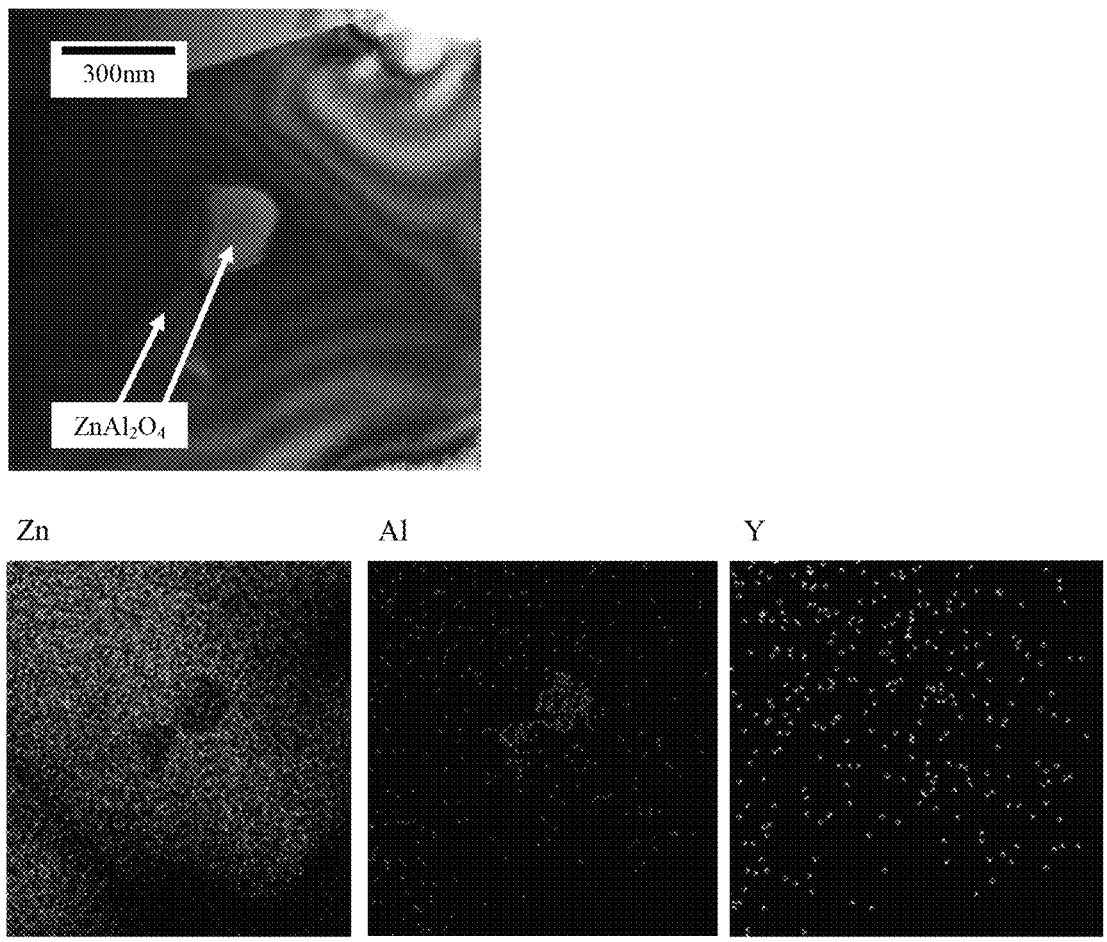
FIG. 8 is microphotographs showing the results of an elementary analysis by a transmission electron microscope-energy dispersion X-ray spectrometry of a thermoelectric conversion material according to the present invention.
Figure 9:
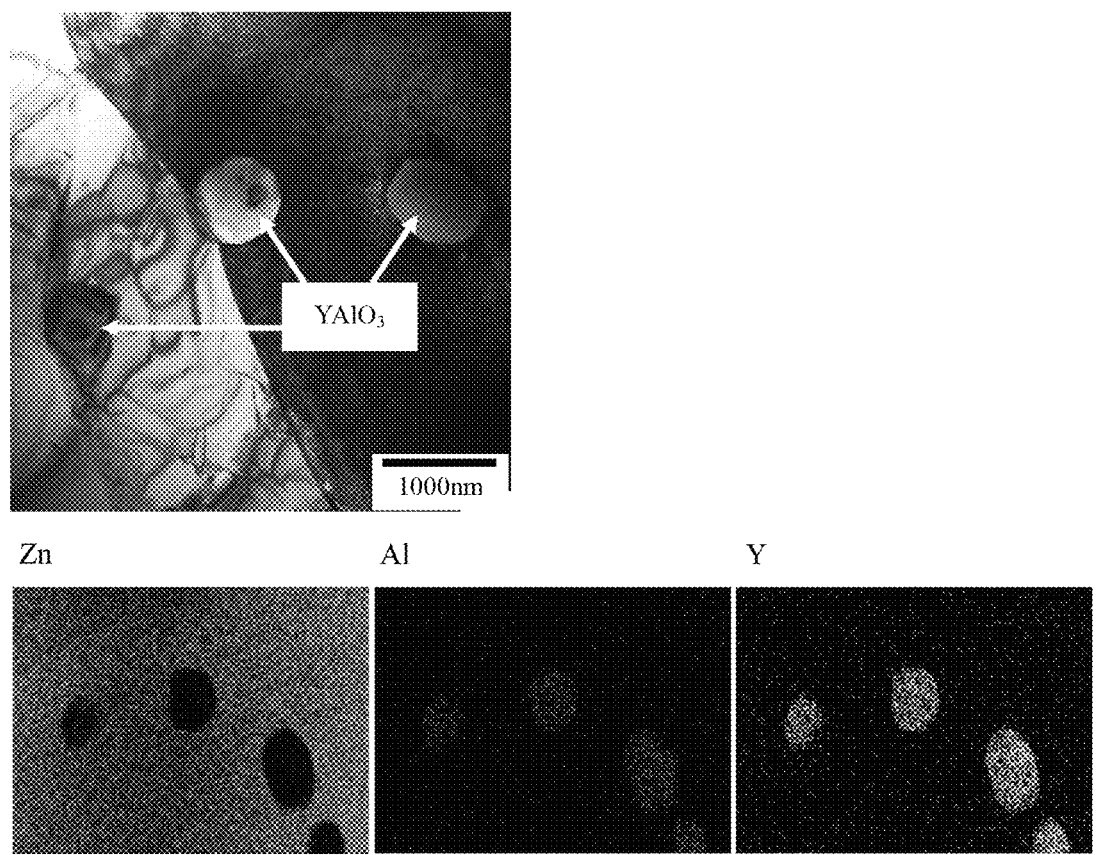
FIG. 9 is microphotographs showing the results of an elementary analysis by a transmission electron microscope-energy dispersion X-ray spectrometry of a thermoelectric conversion material according to the present invention.

In samples 11 and 35, an observation was made under a transmission electron microscope. Further, for Zn, Al, and Y, element mapping was carried out by an energy dispersion-type X-ray spectroscopy. As a result, photographs obtained by the observation were as shown in FIGS. 8 and 9. For both the samples, it was confirmed that aluminum and yttrium were present within the particles of zinc oxide.

Evaluation 5: Scanning Auger Microscopic Analysis

Figure 10:
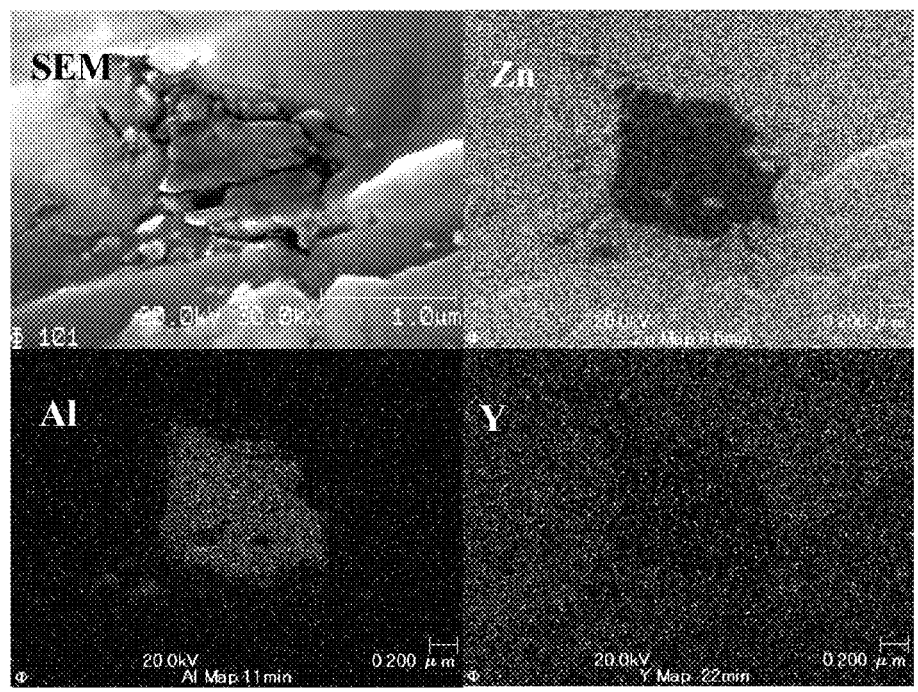
FIG. 10 is microphotographs showing the results of a scanning auger microscopic analysis of a thermoelectric conversion material according to the present invention.

FIG. 10 shows the results of an analysis of a structure of sample 11 prepared by a coprecipitation method under a scanning auger microscope ("PHI700," manufactured by ULVAC-PHI, INC.). It was found by observation under a scanning electron microscope that particles of spinel $ZnAl_2O_4$ were surrounded by zinc oxide. An element mapping analysis of the structure was carried out. As a result, it was found that, for the spinel compound, only Zn and Al were detected as the metal, whereas, for the surrounding zinc oxide portion, very small amounts of Al and Y other than Zn were homogeneously distributed, suggesting that Al and Y were homogeneously dissolved as a solid solution in the structure of zinc oxide.

Evaluation 6: Time-of-Flight Secondary Ion Mass Spectrometric Analysis (TOF-SIMS)

Figure 11:
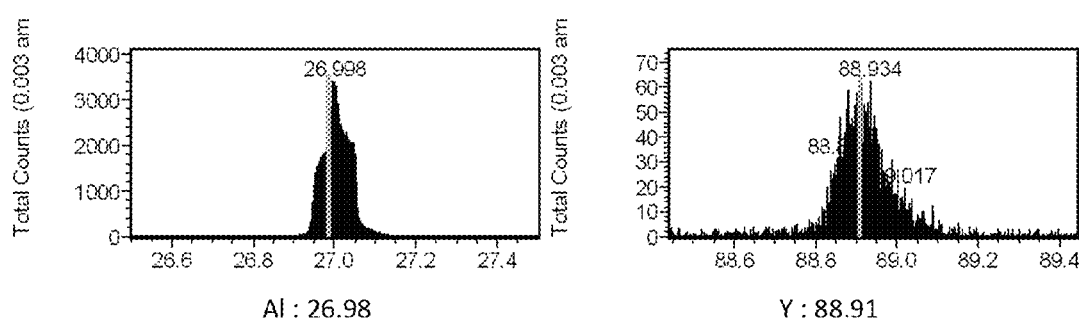
FIG. 11 is a graph showing the results of a time-of-flight secondary ion mass spectrometric analysis of a thermoelectric conversion material according to the present invention.

A high-sensitivity analysis of trace metals in a zinc oxide structure portion of sample 11 was carried out with a time-of-flight secondary ion mass spectrometric analyzer ("TRIFT V nanoTOF," manufactured by ULVAC-PHI, INC.). The results are shown in FIG. 11. A quantitative analysis for each of elements could be carried out by a time-of-flight difference, and it was found that Y and Al were homogeneously present in the structure of zinc oxide.

TABLE 1

| | Mol ratio of each metal species | | | | | σRT @Room-teperature (S·cm⁻¹) | Electro-conductivity $\sigma_{972}$ @972° C. (S·cm⁻¹) | [Seebek coefficient] α @972° C. ($\mu$V·K⁻¹) | power factor $\alpha^2 \sigma_{972}$ @972° C. (×10⁻⁴ W·K⁻²m⁻¹) | Thermal conductivity κ @972° C. (W·m⁻¹·K⁻¹) | ZT @ 972° C. |
|---|---|---|---|---|---|---|---|---|---|---|---|
| | Zn $1-x-y$ | M (Rare Earth) y | Al x | x + y | Kind of M | Ion Radius (pm) | | | | | | |
| 11 | 0.9772 | 0.014 | 0.009 | 0.023 | Y | 90.0 | 765 | 381 | 258 | 25.3 | 5.40 | 0.58 |
| 12 | 0.9600 | 0.010 | 0.030 | 0.040 | Y | 90.0 | | 270 | 197 | 10.5 | | |
| 13 | 0.9600 | 0.010 | 0.030 | 0.040 | Y | 90.0 | | 405 | 192 | 14.9 | | |
| 14 | 0.9600 | 0.020 | 0.030 | 0.040 | Y | 90.0 | | 420 | 195 | 16.0 | | |
| 15 | 0.9600 | 0.010 | 0.030 | 0.040 | Ce | 101.0 | | 314 | 164 | 8.5 | | |
| 16 | 0.9600 | 0.010 | 0.030 | 0.040 | La | 104.5 | | 285 | 179 | 9.1 | | |
| 21 | 0.985 | 0.005 | 0.01 | 0.015 | Y | 90.0 | | | | 8.2 | 6.23 | 0.21 |
| 22 | 0.975 | 0.005 | 0.02 | 0.025 | Y | 90.0 | | | | 10.3 | 4.70 | 0.32 |
| 23 | 0.965 | 0.005 | 0.03 | 0.035 | Y | 90.0 | | | | 12.1 | 4.80 | 0.29 |
| 24 | 0.955 | 0.005 | 0.04 | 0.045 | Y | 90.0 | | | | 10.8 | 5.51 | 0.24 |
| 25 | 0.945 | 0.005 | 0.05 | 0.055 | Y | 90.0 | | | | 10.5 | | |
| 26 | 0.985 | 0.01 | 0.005 | 0.015 | Y | 90.0 | | | | 9.6 | 4.08 | 0.29 |
| 27 | 0.98 | 0.01 | 0.01 | 0.02 | Y | 90.0 | 882 | 330 | 170 | 9.5 | | |
| 28 | 0.975 | 0.01 | 0.015 | 0.025 | Y | 90.0 | | | | 8.6 | | |
| 29 | 0.97 | 0.01 | 0.02 | 0.03 | Y | 90.0 | 1422 | 274 | 181 | 9.0 | 5.02 | 0.26 |
| 30 | 0.96 | 0.01 | 0.03 | 0.04 | Y | 90.0 | 1498 | 405 | 191 | 14.0 | 5.41 | 0.34 |
| 31 | 0.95 | 0.01 | 0.04 | 0.05 | Y | 90.0 | | | | 10.6 | 4.51 | 0.29 |
| 32 | 0.94 | 0.01 | 0.05 | 0.06 | Y | 90.0 | — | 345 | 155 | 8.3 | | |
| 33 | 0.97 | 0.02 | 0.01 | 0.03 | Y | 90.0 | 330 | 263 | 173 | 7.9 | | |
| 34 | 0.96 | 0.02 | 0.02 | 0.04 | Y | 90.0 | 743 | 304 | 185 | 10.5 | 5.77 | 0.23 |
| 35 | 0.95 | 0.02 | 0.03 | 0.05 | Y | 90.0 | 1259 | 348 | 199 | 14.5 | 4.26 | 0.41 |
| 36 | 0.94 | 0.02 | 0.04 | 0.06 | Y | | | | | 10.4 | | |
| 37 | 0.93 | 0.02 | 0.05 | 0.07 | Y | 90.0 | 698 | 247 | 171 | 7.3 | | |
| 38 | 0.95 | 0.025 | 0.03 | 0.06 | Y | 90.0 | | | | 9.1 | 4.06 | 0.28 |
| 39 | 0.94 | 0.025 | 0.04 | 0.07 | Y | 90.0 | | | | 9.4 | | |
| 40 | 0.95 | 0.03 | 0.02 | 0.05 | Y | 90.0 | | 299 | 158 | 7.2 | | |
| 41 | 0.94 | 0.03 | 0.03 | 0.06 | Y | 90.0 | — | 243 | 170 | 7.0 | | |
| 42 | 0.93 | 0.05 | 0.02 | 0.07 | Y | 90.0 | — | 276 | 163 | 7.3 | | |
| 43 | 0.92 | 0.05 | 0.03 | 0.08 | Y | 90.0 | — | 288 | 154 | 6.9 | | |
| 44 | 0.90 | 0.05 | 0.05 | 0.10 | Y | 90.0 | 405 | 183 | 179 | 5.9 | | |
| 45 | 0.98 | 0.02 | 0 | 0.02 | Y | 90.0 | <0.001 | 8 | 403 | 1.3 | | |
| 46 | 0.96 | 0.01 | 0.03 | 0.04 | La | 104.5 | — | 263 | 169 | 7.5 | 4.65 | 0.20 |
| 47 | 0.96 | 0.01 | 0.03 | 0.04 | Ce | 101.0 | 490 | 365 | 144 | 7.6 | 4.57 | 0.21 |
| 48 | 0.96 | 0.01 | 0.03 | 0.04 | Eu | 94.7 | 350 | 371 | 142 | 7.5 | | |
| 49 | 0.96 | 0.01 | 0.03 | 0.04 | Gd | 93.8 | 390 | 360 | 143 | 7.4 | | |
| 50 | 0.96 | 0.01 | 0.03 | 0.04 | Dy | 91.2 | 370 | 379 | 140 | 7.5 | | |
| 51 | 0.96 | 0.01 | 0.03 | 0.04 | Ho | 90.1 | — | 268 | 167 | 7.5 | | |
| 52 | 0.96 | 0.01 | 0.03 | 0.04 | Er | 89.0 | 230 | 245 | 146 | 5.2 | | |
| 53 | 0.96 | 0.01 | 0.03 | 0.04 | Tm | 88.0 | 35 | 85 | 158 | 2.1 | | |
| 54 | 0.96 | 0.01 | 0.03 | 0.04 | Yb | 86.8 | 40 | 107 | 157 | 2.6 | | |
| 55 | 0.96 | 0.01 | 0.03 | 0.04 | Sc | 74.5 | 65 | 128 | 149 | 2.9 | 2.91 | 0.12 |
| 56 | 0.99 | 0 | 0.01 | 0.01 | — | — | — | 345 | 151 | 7.9 | | |
| 57 | 0.98 | 0 | 0.02 | 0.02 | — | — | — | 358 | 146 | 7.7 | 6.04 | 0.16 |
| 58 | 0.97 | 0 | 0.03 | 0.03 | — | — | — | 243 | 178 | 7.7 | | |
| 59 | 0.95 | 0 | 0.05 | 0.05 | — | — | — | 235 | 163 | 6.3 | | |
| 60 | 1.00 | 0 | 0 | 0.00 | — | | | | | 1.0 | | |
| 71 | 0.96 | 0.01 | 0.03 | 0.04 | Ce | 101.0 | | 161 | 180 | 5.2 | | |
| 72 | 0.96 | 0.01 | 0.03 | 0.04 | La | 104.5 | | 173 | 177 | 5.4 | | |
| 73 | 0.96 | 0.01 | 0.03 | 0.04 | Y | 90.0 | | 259 | 172 | 7.6 | | |

The invention claimed is:

1. A thermoelectric conversion material which is represented by compositional formula (I):

$$Zn_{(1-x-y)}Al_xY_yO \quad (I)$$

wherein Zn represents zinc; Al represents aluminum; Y represents yttrium; and x>0, y>0, and x+y<0.1, and which has a structure in which at least a part of aluminum and yttrium are present in crystal lattices of zinc oxide and/or between crystal lattices of zinc oxide, wherein a part of the aluminum is in particles which comprise an oxide of zinc and aluminum having a formula ($ZnAl_2O_4$) and are present within other particles composed mainly of zinc oxide.

2. The thermoelectric conversion material according to claim 1, wherein, in formula (I), x+y≤0.07.

3. The thermoelectric conversion material according to claim 1, wherein, in formula (I), x+y≤0.06.

4. The thermoelectric conversion material according to claim 1, wherein, in formula (I), y<x+0.01.

5. The thermoelectric conversion material according to claim 1, wherein, in formula (I), y≤x.

6. A process for producing a thermoelectric conversion material,
the process comprising the steps of providing an aqueous solution comprising a zinc ion, a rare earth element ion, and an aluminum ion; producing an oxide precursor from the aqueous solution; and firing the precursor to obtain an oxide,
wherein the rare earth element is selected from the group consisting of yttrium (Y) and rare earth elements having a larger ion radius than yttrium: lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho), wherein the oxide is represented by compositional formula (I):

$$Zn_{(1-x-y)}Al_xY_yO \qquad (I)$$

wherein Zn represents zinc; Al represents aluminum; Y represents yttrium; and x>0, y>0, and x+y<0.1, and which has a structure in which at least a part of the aluminum and yttrium is present in crystal lattices of zinc oxide and/or between crystal lattices of zinc oxide, wherein a part of the aluminum is in particles which comprise an oxide of zinc and aluminum having a formula ($ZnAl_2O_4$) and are present within other particles composed mainly of zinc oxide.

7. A process for producing a thermoelectric conversion material, the process comprising the steps of providing an aqueous solution comprising a zinc ion, a rare earth element ion, and an aluminum ion; producing an oxide precursor from the aqueous solution; and firing the precursor to obtain an oxide, wherein the rare earth element is selected from the group consisting of yttrium (Y) and rare earth elements having a larger ion radius than yttrium: lanthanum (La), cerium (Ce), praseodymium (Pr), neodymium (Nd), promethium (Pm), samarium (Sm), europium (Eu), gadolinium (Gd), terbium (Tb), dysprosium (Dy), and holmium (Ho), wherein the oxide is represented by formula:

$$Zn_{(1-x-y)}Al_xM_yO$$

wherein Zn represents zinc; Al represents aluminum; M represents a rare earth element where those having a smaller ion radius than yttrium are excluded; and x>0, y>0, and x+y<0.1.

wherein a part of the aluminum is in particles which comprise an oxide of zinc and aluminum having a formula ($ZnAl_2O_4$) and are present within other particles composed mainly of zinc oxide.

8. A thermoelectric conversion material obtained by a process according to claim 6, wherein at least a part of aluminum is in particles which comprise an oxide of zinc and aluminum having a formula ($ZnAl_2O_4$) and are present within other particles composed mainly of zinc oxide.

9. A thermoelectric conversion material which is represented by formula:

$$Zn_{(1-x-y)}Al_xM_yO$$

wherein Zn represents zinc; Al represents aluminum; M represents a rare earth element where those having a smaller ion radius than yttrium are excluded; and x>0, y>0, and x+y<0.1, wherein at least a part of aluminum is in particles which comprise an oxide of zinc and aluminum having a formula ($ZnAl_2O_4$) and are present within other particles composed mainly of zinc oxide.

* * * * *